US012554280B2

(12) United States Patent
Veluri et al.

(10) Patent No.: US 12,554,280 B2
(45) Date of Patent: Feb. 17, 2026

(54) BUFFER CIRCUIT FOR CAPACITIVE LOADS

(71) Applicant: SEMICONDUCTOR COMPONENTS INDUSTRIES, LLC, Scottsdale, AZ (US)

(72) Inventors: Shiva Shanthan Veluri, Bangalore (IN); Anirudh Oberoi, New Delhi (IN)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 273 days.

(21) Appl. No.: 18/470,626

(22) Filed: Sep. 20, 2023

(65) Prior Publication Data

US 2025/0093901 A1 Mar. 20, 2025

(51) Int. Cl.

*G05F 3/26* (2006.01)
*G05F 1/575* (2006.01)
*H03F 3/45* (2006.01)

(52) U.S. Cl.

CPC .............. *G05F 3/262* (2013.01); *G05F 1/575* (2013.01); *H03F 3/45475* (2013.01)

(58) Field of Classification Search

CPC . G05F 1/56; G05F 1/565; G05F 1/575; G05F 3/262

See application file for complete search history.

(56) References Cited

U.S. PATENT DOCUMENTS

2015/0137780 A1* 5/2015 Lerner .................... G05F 1/565 323/280
2022/0308609 A1* 9/2022 Koay ...................... G05F 1/565

FOREIGN PATENT DOCUMENTS

CN 114756076 A * 7/2022 ............... G05F 1/56

OTHER PUBLICATIONS

Harikumar, Prakash, et al., "Design of a Reference Voltage Buffer for a 10-bit 50 MS/s SAR ADC in 65 nm CMOS", International Symposium on Circuits and Systems (ISCAS), 2015, pp. 249-252.

Wong, Stephen L., et al., "An Efficient CMOS Buffer for Driving Large Capacitive Loads", Journal of Solid-State Circuits, vol. SC-21, No. 3, Jun. 1986, pp. 464-469.

Mak, Kai Ho, et al., "A Signal- and Transient-Current Boosting Amplifier for Large Capacitive Load Applications", IEEE Transactions on Circuits and Systems I: Regular Papers, vol. 61, No. 10, Oct. 2014, pp. 2777-2785.

Jimenez, Mariano, et al., "A New Low-Voltage CMOS Unity-Gain Buffer", 2006 International Symposium on Circuits and Systems, May 2006, pp. 919-922.

(Continued)

*Primary Examiner* — Alex Torres-Rivera
*Assistant Examiner* — Ularislao Cordova
(74) *Attorney, Agent, or Firm* — Dickinson Wright PLLC

(57) ABSTRACT

A reference buffer circuit for buffering a reference voltage is disclosed. The reference buffer circuit includes an input circuit that may generate a replica of the reference voltage. A feedback circuit may generate a charging current using a current mirror circuit and a bias current. A value of the charging current may be greater than a value of the bias current. The feedback circuit may provide a buffered version of the reference voltage at a reference node using the charging current and the replica voltage. An output stage circuit may sink a compensation current from the reference node.

20 Claims, 8 Drawing Sheets

(56) References Cited

OTHER PUBLICATIONS

Carvajal, Ramon G., et al., "The Flipped Voltage Follower: A Useful Cell for Low-Voltage Low-Power Circuit Design", IEEE Transactions on Circuits and Systems I: Regular Papers, vol. 52, No. 7, Jul. 2005, pp. 1276-1291.

* cited by examiner

BUFFER CIRCUIT FOR CAPACITIVE LOADS

BACKGROUND

Technical Field

This disclosure is related to electronic circuits and, more particularly, to reference voltage driver and buffer circuits.

Description of the Related Art

Reference voltage buffer circuits (also referred to as "reference buffer circuits") which buffer or drive reference voltages that are independent of power supply and temperature variation can be used in a variety of applications. Such circuits can be used to drive reference voltages for analog-to-digital converter (ADC) circuits, common-mode drivers in amplifier circuits, and other analog circuits. Reference buffer circuits may be used in motion sensor circuits, image sensor circuits, liquid crystal display (LCD) driver circuits, and the like.

SUMMARY

Various embodiments of a reference buffer circuit are disclosed. Broadly speaking, a reference buffer circuit includes an input circuit, a feedback circuit, and an output stage circuit. In various embodiments, the input circuit may be configured to generate a replica voltage using a reference voltage, wherein the replica voltage is offset from the reference voltage. The feedback circuit may be configured to generate a bias current, generate a charging current using the bias current, wherein a value of the charging current is greater than a value of the bias current, and provide a buffered reference voltage at a reference node using the charging current and the replica voltage. The output stage circuit may be configured to sink, based on the buffered reference voltage, an adjustment current from the reference node.

BRIEF DESCRIPTION OF THE DRAWINGS

For a detailed description of example embodiments, reference will now be made to the accompanying drawings in which.

Figure 1:
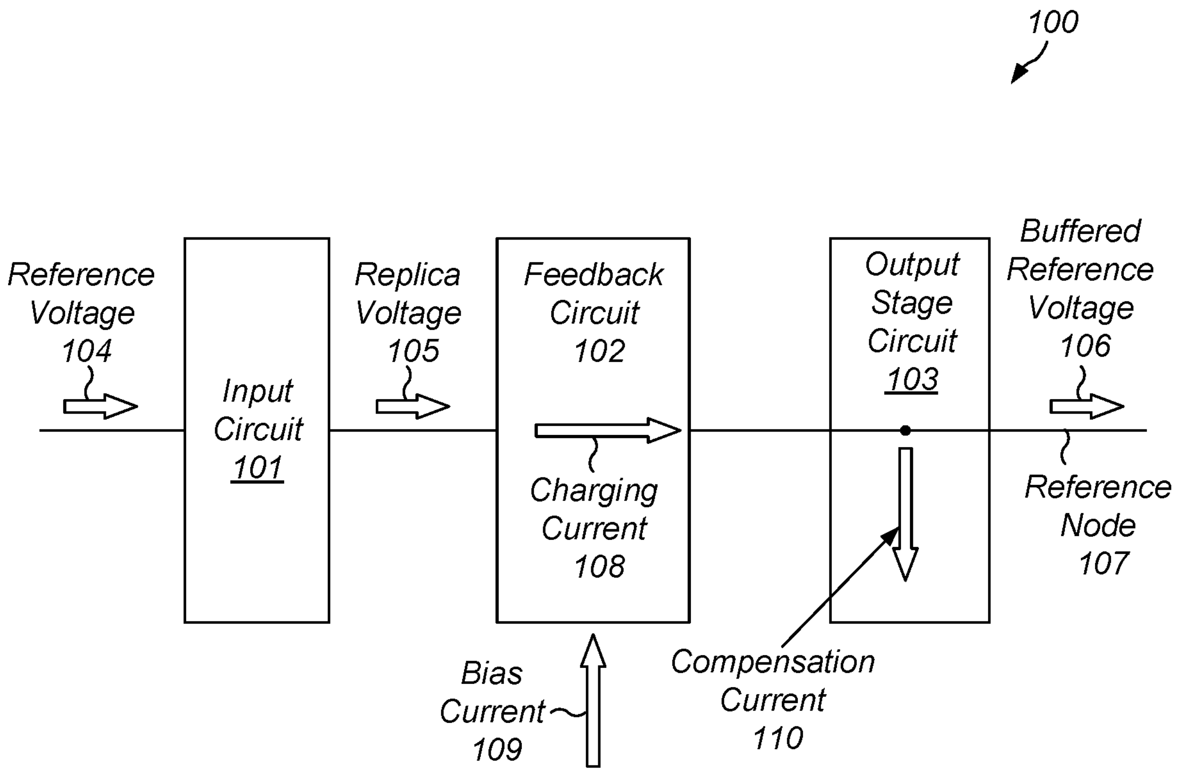
FIG. 1 is a block diagram of an embodiment of a reference buffer circuit.

Many of the electrical connections in the drawings are shown as direct couplings having no intervening devices, but are not expressly stated as such in the following description. Nevertheless, this paragraph shall serve as antecedent basis in the claims for referencing any electrical connection as "directly coupled" for electrical connections shown in the drawing with no intervening device(s).

Definitions

Various terms are used to refer to particular system components. Different companies may refer to a component by different names—this document does not intend to distinguish between components that differ in name but not function. In the following discussion and in the claims, the terms "including" and "comprising" are used in an open-ended fashion and thus should be interpreted to mean "including, but not limited to . . . " Also, the term "couple" or "couples" is intended to mean either an indirect or direct connection. Thus, if a first device couples to a second device, that connection may be through a direct connection or through an indirect connection via other devices and connections.

"A," "an," and "the," as used herein, refers to both singular and plural referents unless the context clearly dictates otherwise. By way of example, "a processor" programmed to perform various functions refers to one processor programmed to perform each and every function, or more than one processor collectively programmed to perform each of the various functions.

In relation to electrical devices (whether stand alone or as part of an integrated circuit), the terms "input" and "output" refer to electrical connections to the electrical devices, and shall not be read as verbs requiring action. For example, a differential amplifier (such as an operational amplifier) may have a first differential input and a second differential input, and these "inputs" define electrical connections to the operational amplifier, and shall not be read to require inputting signals to the operational amplifier.

"Assert" shall mean creating or maintaining a first predetermined state of a Boolean signal. Boolean signals may be asserted high, or with a higher voltage, and Boolean signals may be asserted low, or with a lower voltage, at the discretion of the circuit designer. Similarly, "de-assert" shall mean creating or maintaining a second predetermined state of the Boolean signal, opposite the asserted state.

"FET" shall mean a field-effect transistor, such as a junction-gate FET (JFET), a metal-oxide semiconductor field-effect transistor (MOSFET), Fin field-effect transistor (FinFET), or gate-all-around field-effect transistor (GAAFET).

"Closing" in reference to an electrically controlled switch (e.g., a FET) shall mean making the electrically controlled switch conductive. For example, closing a FET used as an electrically controlled switch may mean driving the FET to a full conductive state.

"Opening" in reference to an electrically controlled switch (e.g., a FET) shall mean making the electrically controlled switch non-conductive.

"Controller" or "controller circuit" shall mean, alone or in combination, individual circuit components, an application specific integrated circuit (ASIC), a microcontroller with controlling software, a reduced-instruction-set computing (RISC) circuit with controlling software, a digital signal processor (DSP), a processor with controlling software, a programmable logic device (PLD), a field programmable gate array (FPGA), or a programmable system-on-a-chip (PSOC), configured to read inputs and drive outputs responsive to the inputs.

DETAILED DESCRIPTION

Various sensor circuits employ reference voltage buffer circuits that drive or buffer reference voltages that are substantially independent of variations in manufacturing, power supply voltage variation, and temperature variation. Such sensor circuits may use buffered reference voltages as points of comparison for generated signals, as well as to generate bias currents and voltages for analog circuits.

One type of sensor circuit that employs reference voltage buffer circuits is an image sensor circuit. An image sensor circuit can include multiple pixel circuits that generate corresponding analog signals whose values correspond to an amount of light striking the pixel. The image sensor circuit converts the analog signals into digital bits that can be further processed into an image for display.

To convert the analog signals generated by pixel circuits into digital bits, the image sensor circuit employs analog-to-digital converter circuits. Various types of analog-to-digital converter circuits may be employed, including Wilkinson analog-to-digital converter circuits, direct-conversion (or "flash") analog-to-digital converter circuits, and successive-approximation analog-to-digital converter circuits.

In successive-approximation analog-to-digital converter circuits, an approximation value, i.e., a number of bits, is converted to a test analog value using a digital-to-analog converter circuit. The test analog value is compared to the analog signal to be converted. Based on a result of the comparison, the approximation value is adjusted. The process is repeated until the test analog value is substantially the same as the analog signal. At that point, the bits included in the approximation value correspond to the value of the analog signal.

To generate the test analog value, the digital-to-analog converter circuit charges capacitors of different values to a reference voltage. Once the capacitors are charged, the stored charge is combined on an input pin of a comparator circuit to generate the test analog value. As the capacitors are charged and discharged, currents can be drawn from and injected into an output node of a reference buffer circuit driving the reference voltage. These currents can cause the reference voltage to fluctuate until the reference buffer circuit has time to re-regulate the reference voltage. The time during which the reference voltage is not in its desired range can impact the bandwidth and/or accuracy of the analog-to-digital converter circuit.

The embodiments described herein may provide techniques for buffering a reference voltage for a load circuit using a reference buffer circuit that has a low output impedance or a high unity-gain bandwidth to compensate for large transient and slew currents on its output. By employing such a reference buffer circuit, variations in the reference voltage due to transient currents and the output settling time of the reference voltage may be reduced, thereby improving performance of the load circuit.

A block diagram of an embodiment of a reference buffer circuit is depicted in FIG. 1. As illustrated, reference buffer circuit 100 includes input circuit 101, feedback circuit 102, and output stage circuit 103.

Input circuit 101 is configured to generate replica voltage 105 using reference voltage 104. In some embodiments, a value of replica voltage 105 may be offset from a value of reference voltage 104. Such an offset may, in some cases, be a positive offset resulting in the value of replica voltage 105 being greater than the value of reference voltage 104. In other cases, the offset may be negative resulting in the value of replica voltage 105 being less than the value of reference voltage 104. In various embodiments, the offset between the value of replica voltage 105 and the value of reference voltage 104 may correspond to a transistor threshold voltage.

Feedback circuit 102 is configured to provide buffered reference voltage 106 at reference node 107. As described below, feedback circuit 102 may include a current mirror circuit configured to generate charging current 108 by "mirroring" bias current 109. A value of the charging current may, in various embodiments, be greater than a value of the bias current. In some embodiments, feedback circuit 102 may be configured to generate buffered reference voltage 106 by sourcing the charging current to reference node 107, and sinking another current, whose value is determined by replica voltage 105, from reference node 107.

Output stage circuit 103 is configured to sink compensation current 110 from reference node 107. Sinking compensation current 110 helps maintain a desired value for buffered reference voltage 106 during periods of time when a load circuit is sourcing current to reference node 107. As described below, different techniques can be employed to sink compensation current 110. It is noted that, in some embodiments, feedback circuit 102 and output circuit 103 can be used independent of input circuit 101 by directly buffering a reference voltage instead of using a replica of the reference voltage.

Figure 2:
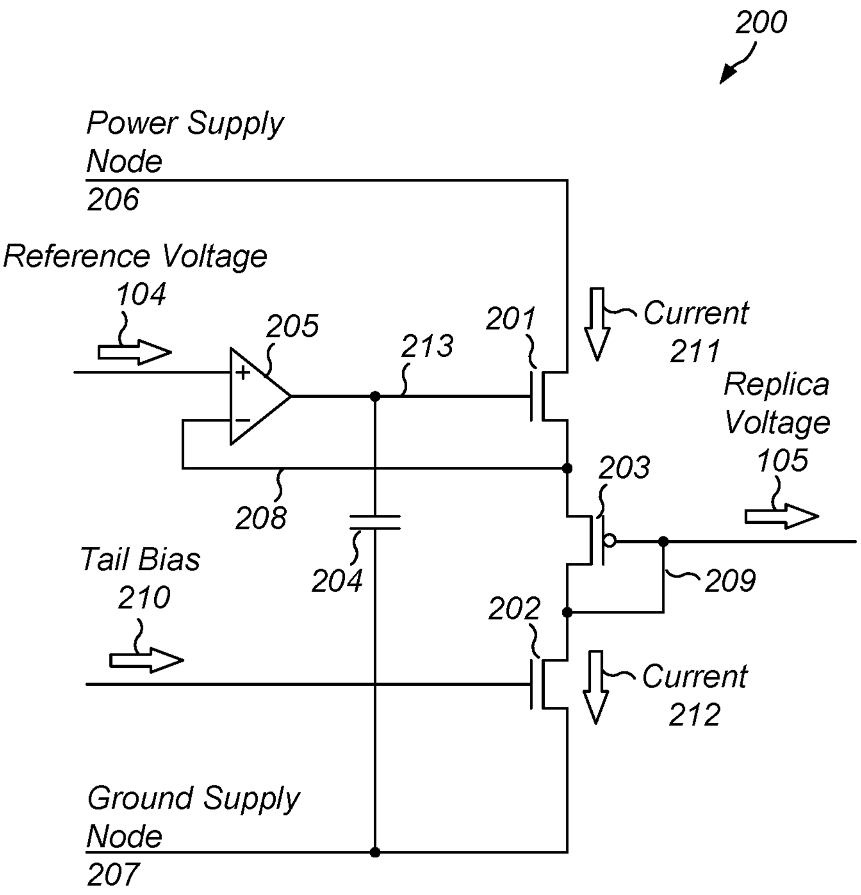
FIG. 2 is a block diagram of an embodiment of an input circuit for a reference buffer circuit.

Turning to FIG. 2, a block diagram of an embodiment of an input circuit is depicted. In various embodiments, input circuit 200 may correspond to input circuit 101 as depicted in FIG. 1. As illustrated, input circuit 200 includes transistors 201-203, capacitor 204, and error amplifier circuit 205.

Transistor 201 is coupled between power supply node 206 and node 208, and is controlled by a voltage level of node 213. Transistor 203 is coupled between node 208 and node 209, and is controlled by replica voltage 105. Transistor 202 is coupled between node 209 and ground supply node 207, and is controlled by tail bias 210.

Error amplifier circuit 205 is configured to generate a voltage level on node 213 using reference voltage 104 and a voltage level of node 208. To generate the voltage level on node 213, error amplifier circuit 205 may, in some embodiments, be configured to perform a comparison between reference voltage 104 and the voltage level of node 208, and generate the voltage level on node 213 using a result of the comparison. In various embodiments, a voltage level of node 213 may be proportional to a difference between reference voltage 104 and the voltage level of node 208. Error amplifier circuit 205 may, in some embodiments, be implemented using a differential amplifier circuit or any other suitable comparator circuit configured to generate an output voltage based on a difference between at least two input voltage levels.

Capacitor 204 is coupled between node 213 and ground supply node 207. In some embodiments, capacitor 204 is configured to filter noise on node 213 to improve stability of input circuit 200. In various embodiments, capacitor 204 may be implemented using a metal-insulator-metal (MIM) structure, a metal-oxide-metal (MOM) structure, or any other suitable capacitor structure available on a semiconductor manufacturing process.

In various embodiments, error amplifier circuit 205 and transistor 201 collectively function as a voltage-to-current converter circuit generating current 211 flowing from power supply node 206 into transistor 203. Transistor 202 is configured to sink current 212 from node 209. A value of current 212 may be based, at least in part, on tail bias 210. A difference between currents 211 and 212 generate a voltage drop across transistor 203 that corresponds to replica voltage 105. In various embodiments, a value of replica voltage 105 may be less than reference voltage 104 by a threshold value associated with transistor 203.

In various embodiments, transistors 201 and 202 may be implemented as n-channel MOSFETs, FinFETs, GAAFETs, or any other suitable transconductance devices. In some embodiments, transistor 203 may be implemented as a p-channel MOSFET, FinFET, GAAFET, or any other suitable transconductance device. Although transistors 201-203 are depicted as single transistors in the embodiment of FIG. 2, in other embodiments, any of transistors 201-203 may be implemented using any suitable series and/or parallel combination of transistors.

Figure 3:
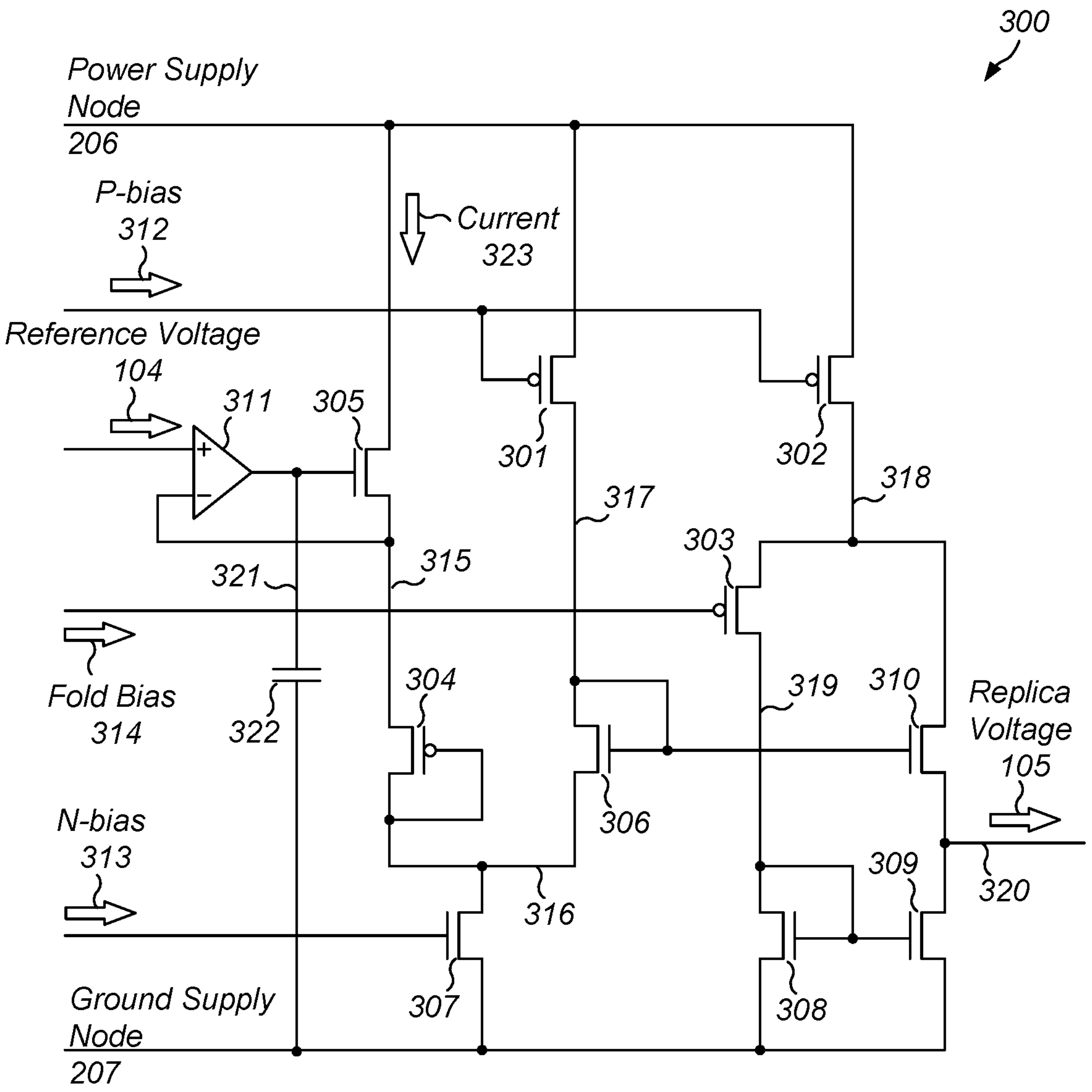
FIG. 3 is a block diagram of a different embodiment of an input circuit for a reference buffer circuit.

In some cases, input circuit 101 should provide a low impedance to the input of feedback circuit 102. A block diagram of another embodiment of an input circuit that employs folding and mirror techniques to reduce its output impedance is depicted in FIG. 3. In various embodiments, input circuit 300 may correspond to input circuit 101 as depicted in FIG. 1. As illustrated, input circuit 300 includes transistors 301-310, error amplifier circuit 311, and capacitor 322.

Transistor 301 is coupled between power supply node 206 and node 317, and is controlled by p-bias 312. In a similar fashion, transistor 302 is coupled between power supply node 206 and node 318, and is also controlled by p-bias 312. Transistor 303 is coupled between node 318 and node 319, and is controlled by fold bias 314.

Transistor 305 is coupled between power supply node 206 and node 315, and is controlled by a voltage level of node 321. Transistor 304 is coupled between node 315 and node 316, and is controlled by a voltage level of node 316. In various embodiments, transistor 304 is referred to as being "diode connected." Transistor 307 is coupled between node 316 and ground supply node 207, and is controlled by n-bias 313. Transistor 306 is coupled between node 317 and node 316, and is controlled by a voltage level of node 317. Transistor 306 may also be referred to as being "diode connected."

Transistor 310 is coupled between node 318 and node 320, and is controlled by the voltage level of node 317. Transistor 308 is coupled between node 319 and ground supply node 207, and is controlled by a voltage level of node 319. Transistor 309 is coupled between node 320 and ground supply node 207, and is also controlled by the voltage level of node 319. In various embodiments, transistors 308 and 309 may be configured to operate as a current mirror circuit, with mirror transistor 309 replicating (or "mirroring") a current flowing in diode-connected transistor 308.

Error amplifier circuit 311 is configured to generate a voltage level on node 321 using reference voltage 104 and a voltage level of node 315. To generate the voltage level on node 321, error amplifier circuit 311 may, in some embodiments, be configured to perform a comparison between reference voltage 104 and the voltage level of node 315, and generate the voltage level on node 321 using a result of the comparison. In various embodiments, a voltage level of node 321 may be proportional to a difference between reference voltage 104 and the voltage level of node 315. Error amplifier circuit 311 may, in some embodiments, be implemented using a differential amplifier circuit or any other suitable comparator circuit configured to generate an output voltage based on a difference between at least two input voltage levels.

Capacitor 322 is coupled between node 321 and ground supply node 207. In some embodiments, capacitor 322 is configured to filter noise on node 321 to improve stability of input circuit 300. In various embodiments, capacitor 322 may be implemented using a MIM structure, a MOM structure, or any other suitable capacitor structure available on a semiconductor manufacturing process.

In various embodiments, error amplifier circuit 311 and transistor 305 collectively function as a voltage-to-current converter circuit generating current 323 flowing from power supply node 206 into transistor 305, which, in turn, flows through transistor 304 into node 316. Transistor 307 is configured to sink a current from node 316 using n-bias 313.

Transistor 301 is configured to generate, based on p-bias 312, a current flowing from power supply node 206 into node 317. A portion of the current flowing in node 317 flows through transistor 306 into node 316 based on a voltage level of node 317. In various embodiments, the voltage level on node 317 is based on a difference between the respective currents flowing through transistors 304 and 306.

Transistor 302 is configured to generate a current flowing from power supply node 206 into node 318 based on p-bias 312. A portion of the current flowing into node 318 from transistor 302 flows into transistor 303 based on fold bias 314. Transistors 306 and 310 may, in various embodiments, function as a current mirror circuit with the current flowing in diode-connected transistor 306 being replicated (or "mirrored") in transistor 310. In a similar fashion, transistors 308 and 309 are configured to function as a current mirror circuit with the current flowing from transistor 303 into diode-connected transistor 308 being replicated (or "mirrored") in transistor 309.

A difference between the current flowing in transistor 310 and the current flowing in transistor 309 generates replica voltage 105. In various embodiments, a value of replica voltage 105 on node 320 is based on a difference in currents flowing in transistors 309 and 310. It is noted that input circuit 300 also generates replica voltage 105 with an offset from reference voltage 104.

In various embodiments, transistors 301-304 may be implemented as p-channel MOSFETs, FinFETs, GAAFETs, or any other suitable transconductance devices, while transistors 305-310 may be implemented as n-channel MOSFETs, FinFETs, GAAFETs, or any other suitable transconductance devices. Although transistors 301-310 are depicted as single transistors in the embodiment of FIG. 3, in other embodiments, any of transistors 301-310 may be implemented using any suitable series and/or parallel combination of transistors.

Figure 4:
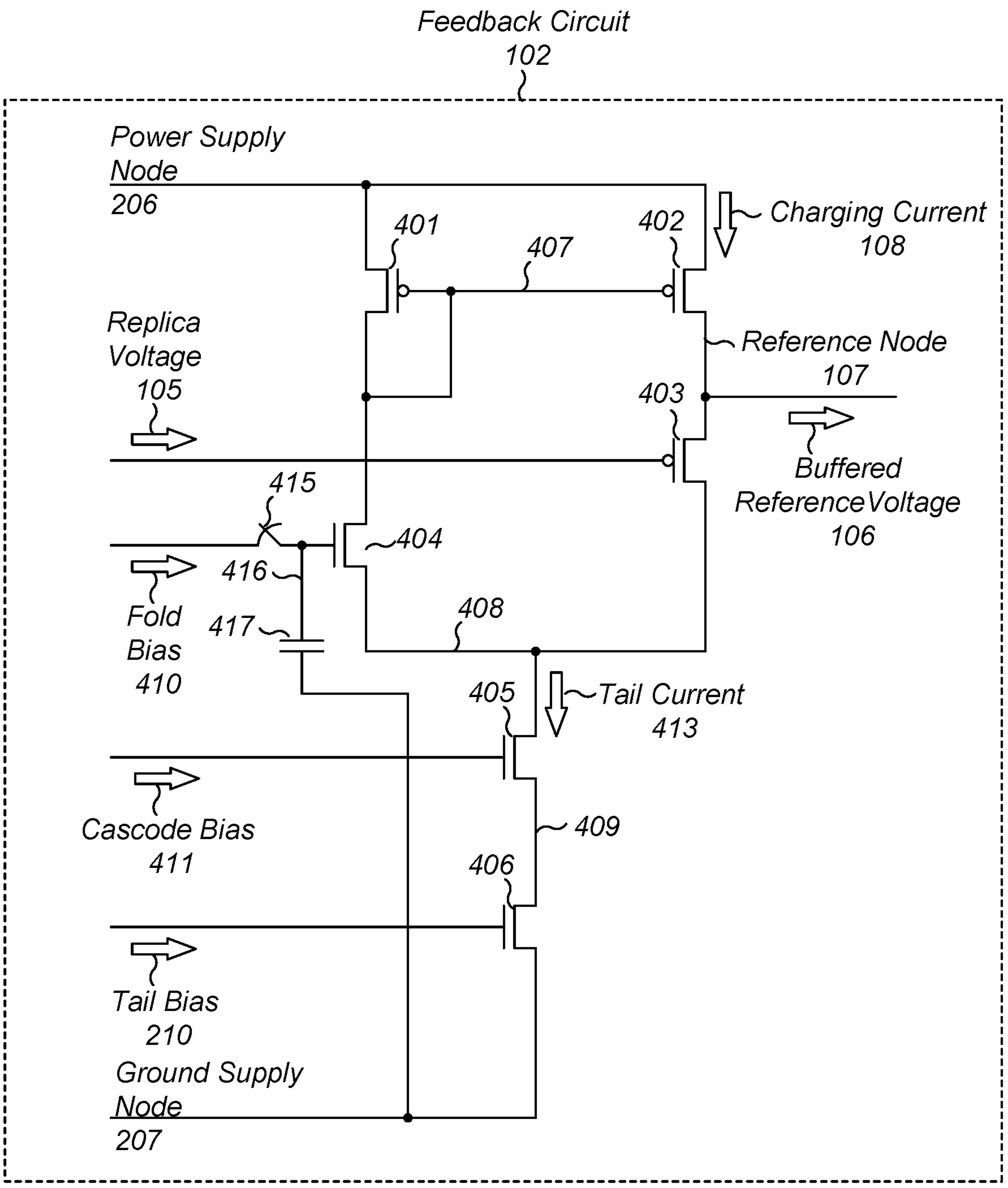
FIG. 4 is a block diagram of an embodiment of a feedback circuit for a reference buffer circuit.

Turning to FIG. 4, a block diagram of an embodiment of feedback circuit 102 is depicted. As illustrated, feedback circuit 102 includes transistors 401-406, switch 415, and capacitor 417.

Transistor 401 is coupled between power supply node 206 and node 407, and is controlled by a voltage level of node 407. Transistor 402 is coupled between power supply node 206 and reference node 107, and is controlled by the voltage level of node 407. In various embodiments, transistors 401 and 402 are configured to operate as a current mirror circuit with a current flowing in transistor 401 being replicated in transistor 402. In some embodiments, transistor 401 is referred to as being "diode connected" since its drain and gate are coupled together, and transistor 402 is referred to as a "mirror transistor" since the current flowing in transistor 401 is replicated (or "mirrored") in transistor 402.

In some embodiments, the beta ratio of transistor 402 is greater than the beta ratio of transistor 401, resulting in the current flowing in transistor 402 being greater than the current flowing in transistor 401 by an amount corresponding to a ratio of the two beta ratios. In some cases, the beta ratio of transistor 402 may be a factor larger than the beta ratio of transistor 401, i.e., $\beta_{402}=k\beta_{401}$, where $\beta_{401}$ is the beta ratio of transistor 401, $\beta_{402}$ is the beta ratio of transistor 402, and k is selected based on a desired change in charging current 108 for a corresponding change in buffered reference voltage 106.

Transistor 403 is coupled between reference node 107 and node 408, and is controlled by replica voltage 105. Transistor 404 is coupled between node 407 and node 408, and is controlled by a voltage level of node 416.

Transistor 405 is coupled between node 408 and node 409, and is controlled by cascode bias 411. Transistor 406 is coupled between node 409 and ground supply node 207, and is controlled by tail bias 210.

In various embodiments, cascode bias 411 and tail bias 210 establish tail current 413 flowing through transistors 405 and 406. Fold bias 410 establishes a current flowing in transistor 404, which also flows through transistor 401. The current flowing through transistor 401 is replicated (or "mirrored") in transistor 402 to create charging current 108. In various embodiments, a value of charging current 108 may be greater than the current flowing in transistor 401 by an amount corresponding to a difference between the respective beta ratios of transistors 401 and 402.

Charging current 108 is sourced to reference node 107 as part of the generation of buffered reference voltage 106. While charging current 108 is being sourced to reference node 107, transistor 403 is configured to sink a portion of charging current 108 from reference node 107. In various embodiments, a value of the portion of charging current 108 is based, at least in part, on replica voltage 105, as well as a value of buffered reference voltage 106.

With the multiplicative effect of the current mirror circuit formed by transistors 401 and 402, high charging rates of reference node 107 can be achieved, thereby improving the response time of reference buffer circuit 100 to an increase in current drawn from reference node 107 by a load circuit. It is noted that while the embodiment of FIG. 4 depicts a current mirror circuit implemented using p-channel transistor, in other embodiments, the current mirror circuit of feedback circuit 102 may be implemented using n-channel transistors. In such cases, charging current 108 may be sunk from reference node 107 as opposed to being sourced to reference node 107. In some embodiments, a current mirror circuit implemented using p-channel transistors and another current mirror circuit implemented using n-channel transistors may both be employed to allow both sourcing current to and sinking current from reference node 107.

In cases where there is a large capacitive load coupled to reference node 107, the dominant pole of the system will be reference node 107. The topology of feedback circuit 102 provides a low output impedance of $1/g_m$ at the non-dominant pole, making it easier to achieve stability for reference buffer circuit 100 without the addition of a compensation network or increasing the power consumption of the circuit.

Additionally, feedback circuit 102 can be operated over a wide range of values for power supply node 206. For example, in some cases, feedback circuit 102 can be operated with the voltage level of power supply node 206 at or near 1.8V, thus reducing power consumption. The use of the current mirror circuit formed by transistors 401 and 402 also allows for the value of reference voltage 104 to approach the voltage level of power supply node 206, thereby allowing reference buffer circuit 100 to be used in a wide range of applications.

Switch 415 is configured to couple fold bias 410 to node 416 which is, in turn, coupled to ground supply node 207 via capacitor 417. In various embodiments, switch 415 and capacitor 417 function as a sample-and-hold circuit. By sampling fold bias 410, kick-back interaction with the feedback of feedback circuit 102 can be reduced. In some embodiments, switch 415 may be implemented using at least one MOSFET, FinFET, GAAFET, or any other suitable transconductance device. Capacitor 417 may, in various embodiments, be implemented using a MIM structure, a MOM structure, or any other suitable capacitor structure available on a semiconductor manufacturing process.

Transistors 401-403 may, in some embodiments, be implemented as p-channel MOSFETs, FinFETs, GAAFETs, or any other suitable transconductance devices. In various embodiments, transistors 404-406 may be implemented as n-channel MOSFETs, FinFETs, GAAFETs, or any other suitable transconductance devices. Although transistors 401-406 are depicted as being single transistors in the embodiment of FIG. 4, in other embodiments, any of transistors 401-406 may be implemented using any suitable series and/or parallel combination of transistors.

Figure 5:
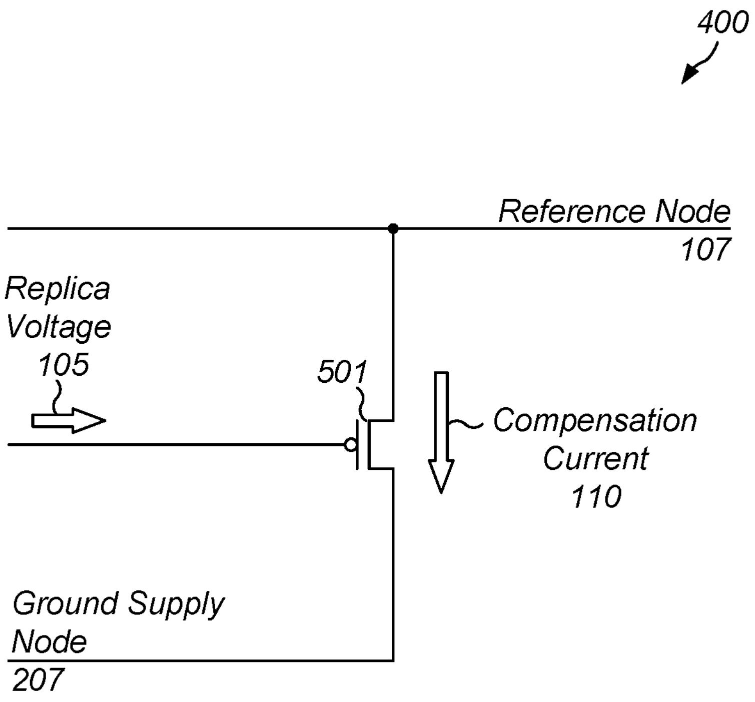
FIG. 5 is a block diagram of an embodiment of an output stage circuit for a reference buffer circuit.

A block diagram of an embodiment of an output stage circuit is depicted in FIG. 5. In various embodiments, output stage circuit 500 may correspond to output stage circuit 103. As illustrated, output stage circuit 500 includes transistor 501.

Transistor 501 is coupled between reference node 107 and ground supply node 207, and is controlled by replica voltage 105. In various embodiments, transistor 501 is configured to sink compensation current 110 from reference node 107 based on a voltage level of reference node 107 and replica voltage 105. In various embodiments, transistor 501 may be configured to function as a source follower during negative slew.

It is noted that transistor 501 will sink a portion of current flowing in transistor 402 of feedback circuit 102. By sinking a portion of the current flowing in transistor 402, transistor 501 may limit the unity-gain bandwidth of feedback circuit 102. In various embodiments, the beta ratio of transistor 501 may be selected based on a trade-off between unity-gain bandwidth and negative slew performance.

Transistor 501 may, in some embodiments, be implemented as a p-channel MOSFET, FinFET, GAAFET, or any other suitable transconductance device. Although transistor 501 is depicted as being a single transistor in the embodiment of FIG. 5, in other embodiments, transistor 501 may be implemented using any suitable series and/or parallel combination of transistors.

Figure 6:
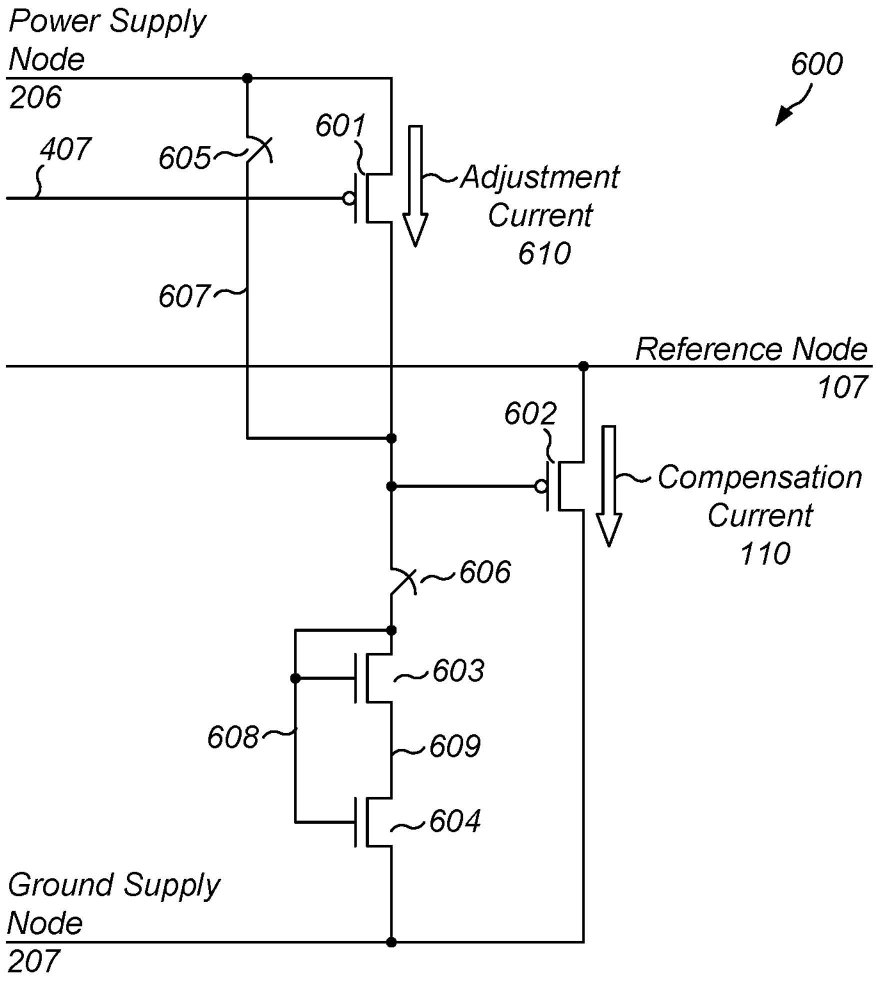
FIG. 6 is a block diagram of a different embodiment of an output stage circuit for a reference buffer circuit.

In the embodiment of FIG. 5, the control terminal of transistor 501 is held at replica voltage 105, which limits a maximum value of compensation current 110 that can be sunk from reference node 107 during negative slew. By adjusting the value of the control terminal, an output stage transistor, such as transistor 501, can be made to vary the amount of current sunk from reference node 107. An embodiment of an output stage circuit that allows for such a varying current is depicted in FIG. 6.

As illustrated, output stage circuit 600 includes transistors 601-604, and switches 605 and 606. In various embodiments, output stage circuit 600 may correspond to output stage circuit 103 as depicted in FIG. 1.

Transistor 601 is coupled between power supply node 206 and node 607, and is controlled by node 407 of feedback circuit 102 as depicted in FIG. 4. Transistor 602 is coupled between reference node 107 and ground supply node 207, and is controlled by a voltage level of node 607.

Transistor 603 is coupled between node 608 and node 609, while transistor 604 is coupled between node 609 and ground supply node 207. Respective control terminals of transistors 603 and 604 are coupled to node 608.

Transistor 601 replicates a small portion of the current flowing in transistor 401, as depicted in FIG. 4, to generate compensation current 110. In various embodiments, the beta ratio of transistor 601 is less than the beta ratio of transistor 401. Adjustment current 610 flows through transistors 603 and 604, generating a voltage on node 607, which modulates the conductance of transistor 602. During negative slew conditions, most of tail current 413 flows through transistor 403, with little current flowing in transistor 401, resulting in a small value for compensation current 110. With little current being supplied to node 607 by transistor 601, node 607 discharges through transistors 603 and 604, increasing a level of activation of transistor 602, thereby increasing a value of compensation current 110, which helps sink current being sourced into reference node 107 by a load circuit.

Switch 605 is coupled between power supply node 206 and node 607, while switch 606 is coupled between node 607 and node 608. In some embodiments, switches 605 and 606 may be employed to disable output stage circuit 600 to save static power when negative slew is not an issue. To disable output stage circuit 600, switch 605 may be closed and switch 606 may be opened, which couples the control terminal of transistor 602 to power supply node 206, rendering transistor 602 inactive. To enable output stage circuit 600, switch 605 may be opened and switch 606 may be closed, which allows the voltage level of the control terminal of transistor 602 to vary based on a current flowing through transistor 601.

Switches 605 and 606 may, in various embodiments, be implemented as metal switches that are programmed open or closed during fabrication. Alternatively, switches 605 and 606 may be implemented with transistors that are controlled by signals determined upon power up, or based on operational modes of a computer system that includes reference buffer circuit 100.

Transistors 601 and 602 may, in some embodiments, be implemented as p-channel MOSFETs, FinFETs, GAAFETs, or any other suitable transconductance devices, while transistors 603 and 604 may be implemented as n-channel MOSFETs, FinFETs, GAAFETs, or any other suitable transconductance devices. Although transistors 601-604 are depicted as being single transistors, in other embodiments, any of transistors 601-604 may be implemented using any suitable series and/or parallel combination of transistors.

Figure 7:
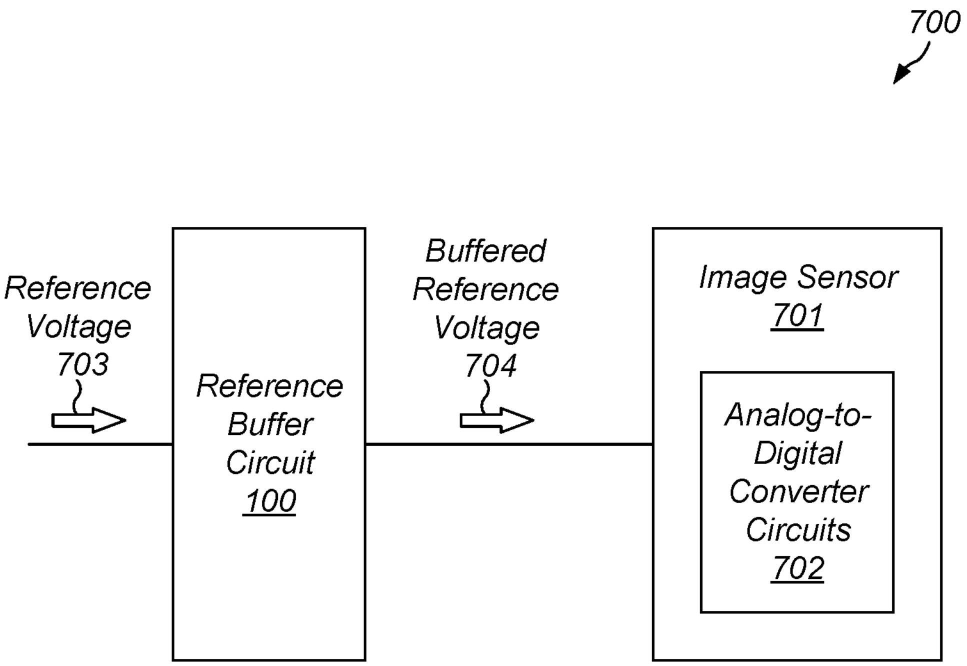
FIG. 7 is a block diagram of an image sensor system.

Turning to FIG. 7, a block diagram of an image sensor system is depicted. As illustrated, image sensor system 700 includes reference buffer circuit 100 and image sensor 701, which includes analog-to-digital converter circuits 702.

As described above, reference buffer circuit 100 is configured to generate buffered reference voltage 704 using reference voltage 703. It is noted that in the embodiment of FIG. 7, reference buffer circuit 100 may include different relative device sizes to select the appropriate negative slew performance and unity-gain bandwidth based on the requirements of image sensor circuit 701.

In various embodiments, analog-to-digital converter circuits 702 may correspond to column analog-to-digital conversion circuits of image sensor 701. To achieve a desired level of performance, the conversion time of analog-to-digital converter circuits 702 should be low. Such conversion times may, in various embodiments, be limited by settling time of buffered reference voltage 704.

Analog-to-digital converter circuits 702 may, in different embodiments, include multiple capacitors as part of a digital-to-analog converter circuit also included in analog-to-digital converter circuits 702. During sampling operations, bottom plates of the multiple capacitors may be coupled to buffered reference voltage 704. As described above, reference buffer circuit 100 may be configured to sink discharging slew currents in order to maintain a desired value for buffered reference voltage 704.

Figure 8:
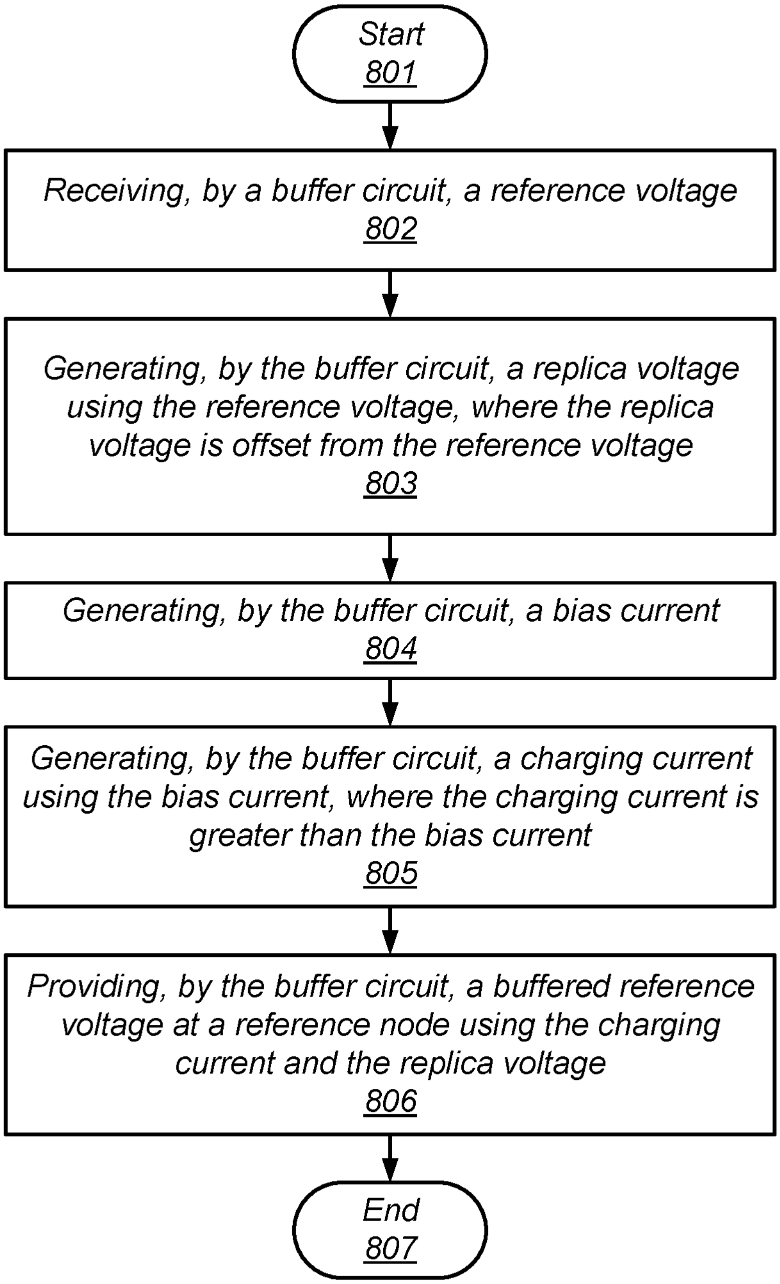
FIG. 8 is a flow diagram of an embodiment of a method for operating a reference buffer circuit.

Turning to FIG. 8, a flow diagram depicting an embodiment of a method for operating a reference buffer circuit is illustrated. The method, which may be applied to various reference buffer circuits including reference buffer circuit 100 as depicted in FIG. 1, begins in block 801.

The method includes receiving, by a buffer circuit, a reference voltage (block 802). In various embodiments, the method may also include generating, by a bandgap reference circuit, the reference voltage.

The method further includes generating, by the buffer circuit, a replica voltage using the reference voltage (block 803). In various embodiments, the replica voltage is offset from the reference voltage. As described above, the replica voltage may be greater than the reference voltage, or less than the reference voltage. In some cases, the difference between the replica voltage and the reference voltage may correspond to a transistor threshold voltage. In some embodiments, generating the replica voltage includes converting the reference voltage to a first current, generating a second current using a bias voltage, and combining the first current and the second current to generate the replica voltage.

The method also includes generating, by the buffer circuit, a bias current (block 804). In various embodiments, the buffer circuit includes a current mirror circuit that includes a diode-connected transistor (e.g., transistor 401) and a mirror transistor (e.g., transistor 402) coupled to a common control node. Generating the bias current may, in some embodiments, include adjusting a voltage of a control terminal of a transistor coupled to the diode-connected transistor.

The method further includes generating, by the buffer circuit, a charging current using the bias current (block 805). In various embodiments, a value of the charging current may be greater than a value of the bias current. In some cases, generating the charging current includes generating, by the mirror transistor, the charging current based on the bias current flowing in the diode-connected transistor.

The method also includes providing, by the buffer circuit, a buffered reference voltage at a reference node using the charging current and the replica voltage (block 806). In some embodiments, providing the buffered reference voltage includes sourcing the charging current to the reference node, and sinking a portion of the charging current from the reference node. A value of the portion of the charging current may, in some embodiments, be based on a value of the replica voltage.

In various embodiments, the buffer circuit includes an output stage circuit. In such cases, the method may further include sinking, by the output stage circuit, a compensation current from the reference node. In some embodiments, sinking the compensation current may include adjusting, by a transistor included in the output stage circuit, a conductance between the reference node and a ground supply node based on a value of the replica voltage. In other embodiments, sinking the compensation current may include generating, by the output stage circuit, an adjustment current (e.g., adjustment current 610) using the bias current, and modifying, by a transistor included in the output stage circuit, a conductance between the reference node and a ground supply node using the adjustment current. In various embodiments, a value of the adjustment current is less than a value of the bias current.

In some cases, the method may also include disabling the output stage circuit. In various embodiments, disabling the output stage circuit may include coupling a control terminal of a transistor included in the output stage circuit that is coupled between the reference node and a ground supply node to a power supply node. The method concludes in block 807.

The present disclosure includes references to "an embodiment" or groups of "embodiments." As used herein, embodiments are different implementations of instances of the disclosed concepts. References to "an embodiment," "some embodiments," and the like do not necessarily refer to the same embodiment. Many embodiments are possible and contemplated, including those specifically disclosed as well as modifications or alternatives that fall within the spirit or scope of the disclosure.

The above disclosure is meant to illustrate some of the principles and various embodiments of the disclosed concepts. Numerous variations and modifications will become apparent to those skilled in the art once the above disclosure is fully appreciated. It is intended that the following claims be interpreted to embrace all such variations and modifications.

What is claimed is:

1. An apparatus, comprising:

an input circuit configured to generate a replica voltage using a reference voltage, wherein the replica voltage is offset from the reference voltage, wherein the replica voltage is less than the reference voltage, and wherein the input circuit is configured to:

convert the reference voltage to a first current;

generate a second current using a bias voltage; and combine the first current and the second current to generate the replica voltage;

a feedback circuit configured to:

generate a bias current;

generate a charging current using the bias current, wherein a value of the charging current is greater than a value of the bias current; and provide a buffered reference voltage at a reference node using the charging current and the replica voltage; and an output stage circuit configured to sink, based on the buffered reference voltage, a compensation current from the reference node.

2. The apparatus of claim 1, wherein to provide the buffered reference voltage, the feedback circuit is further configured to:

source the charging current to the reference node; and sink a portion of the charging current from the reference node, wherein a value of the portion of the charging current is based on the replica voltage.

3. The apparatus of claim 1, wherein the feedback circuit includes a current mirror circuit that includes a diode-connected transistor and a mirror transistor coupled between a power supply node and the reference node, wherein a first beta ratio of the diode-connected transistor is less than a second beta ratio of the mirror transistor, and wherein the mirror transistor is configured to source the charging current to the reference node based on a current flowing in the diode-connected transistor.

4. The apparatus of claim 1, wherein the output stage circuit includes a transistor coupled between the reference node and a ground supply node, wherein the transistor is configured to adjust a conductance between the reference node and the ground supply node based on the buffered reference voltage and the replica voltage.

5. The apparatus of claim 1, wherein the output stage circuit includes a transistor coupled between the reference node and a ground supply node, and wherein the output stage circuit is further configured to:

generate an adjustment current using the bias current, wherein a value of the adjustment current is less than the value of the bias current; and modify a voltage level of a control terminal of the transistor using the adjustment current.

6. The apparatus of claim 1, wherein the output stage circuit is further configured to halt sinking the compensation current based on an operational mode of a computer system that includes the input circuit, the feedback circuit, and the output stage circuit.

7. A method, comprising:

receiving, by a buffer circuit, a reference voltage;

generating, by the buffer circuit, a replica voltage using the reference voltage, wherein the replica voltage is offset from the reference voltage, and wherein generating the replica voltage includes:

converting the reference voltage to a first current;

generating a second current using a bias voltage; and combining the first current and the second current to generate the replica voltage;

generating, by the buffer circuit, a bias current;

generating, by the buffer circuit, a charging current using the bias current, wherein the charging current is greater than the bias current; and providing, by the buffer circuit, a buffered reference voltage at a reference node using the charging current and the replica voltage.

8. The method of claim 7, wherein providing the buffered reference voltage includes:

sourcing the charging current to the reference node; and sinking a portion of the charging current from the reference node, wherein a value of the portion of the charging current is based on the replica voltage.

9. The method of claim 7, wherein the buffer circuit includes an output stage circuit and, further comprising sinking, by the output stage circuit, a compensation current from the reference node.

10. The method of claim 9, wherein the output stage circuit includes a transistor coupled between the reference node and a ground supply node, and wherein sinking the compensation current includes adjusting, by the transistor, a conductance between the reference node and the ground supply node based on a value of the replica voltage.

11. The method of claim 9, wherein the output stage circuit includes a transistor coupled between the reference node and a ground supply node, and further comprising:

generating, by the output stage circuit, an adjustment current using the bias current, wherein a value of the adjustment current is less than a value of the bias current; and modifying, by the transistor, a conductance between the reference node and the ground supply node using the adjustment current.

12. The method of claim 11, further comprising disabling the output stage circuit by coupling a control terminal of the transistor to a power supply node.

13. The method of claim 12, further comprising disabling the output stage circuit based on an operational mode of a computer system that includes the buffer circuit.

14. A system, comprising:

an image sensor circuit coupled to a reference node; and a reference buffer circuit configured to:

receive a reference voltage;

generate a bias current;

generate a charging current using the bias current; and provide a buffered reference voltage at the reference node based on the reference voltage and using the charging current; and generate a replica voltage using the reference voltage, wherein the replica voltage is offset from the reference voltage wherein to generate the replica voltage, the reference buffer circuit is further configured to:

convert the reference voltage to a first current;

generate a second current using a bias voltage; and combine the first current and the second current to generate the replica voltage.

15. The system of claim 14, wherein to provide the buffered reference voltage, the reference buffer circuit is further configured to:

source the charging current to the reference node; and sink a portion of the charging current from the reference node, wherein a value of the portion of the charging current is based on the replica voltage.

16. The system of claim 15, wherein the reference buffer circuit is further configured to sink a compensation current from the reference node.

17. The system of claim 16, wherein to sink the compensation current from the reference node, the reference buffer circuit is further configured to adjust a conductance between the reference node and a ground supply node based on a value of the replica voltage and the buffered reference voltage.

18. The system of claim 16, wherein to sink the compensation current from the reference node, the reference buffer circuit is further configured to:

generate an adjustment current using the bias current, wherein a value of the adjustment current is less than the bias current; and modify a conductance between the reference node and a ground supply node using the adjustment current and the buffered reference voltage.

19. The system of claim 16, wherein the reference buffer circuit is further configured to halt sinking the compensation current based on an operational mode of the system.

20. The system of claim 14, wherein the image sensor circuit is further configured to charge at least one capacitor using the buffered reference voltage.

* * * * *